United States Patent [19]

Aigo

[11] Patent Number: 4,520,934
[45] Date of Patent: Jun. 4, 1985

[54] CRADLE FOR SEMICONDUCTOR ELEMENT CARRIER

[76] Inventor: Seiichiro Aigo, 3-15-13, Negishi, Daito-ku, Tokyo, Japan

[21] Appl. No.: 590,624

[22] Filed: Mar. 19, 1984

[51] Int. Cl.³ ............................................. B65D 85/30
[52] U.S. Cl. ..................... 211/41; 118/500; 206/334; 206/454; 432/258; 294/159
[58] Field of Search ............... 211/41; 118/500; 134/157, 158, 159; 206/334, 454, 455; 269/152; 432/258, 259; 294/143, 146, 159

[56] References Cited

U.S. PATENT DOCUMENTS

| | | | |
|---|---|---|---|
| 3,534,862 | 10/1970 | Shambelan | 211/41 |
| 3,850,296 | 11/1974 | Hirata et al. | 211/41 X |
| 3,934,733 | 1/1976 | Worden | 211/41 X |
| 3,964,957 | 6/1976 | Walsh | 134/159 X |
| 4,056,260 | 11/1977 | David | 211/41 X |
| 4,318,749 | 3/1982 | Mayer | 211/41 X |
| 4,450,960 | 5/1984 | Johnson | 206/454 X |

Primary Examiner—Robert W. Gibson, Jr.
Attorney, Agent, or Firm—Cantor and Lesser

[57] ABSTRACT

In a cradle adapted to receive a carrier, which carries semiconductor elements stored therein, for mounting the carrier on a predetermined position of a spin drier, a pair of stepped portions which are parallel to each other and perpendicular to a rear wall of the cradle is provided on the rear wall of the cradle so that leg portions of the carrier are received between the stepped portions. The stepped portions serve to prevent the leg portions of the carrier from opening during the spinning of the carrier. The cradle can thus avoid damages of the semiconductor elements stored in the carrier, which damages would otherwise be caused to occur due to opening of the leg portions.

10 Claims, 5 Drawing Figures

CRADLE FOR SEMICONDUCTOR ELEMENT CARRIER

BACKGROUND OF THE INVENTION (1) Field of the Invention

This invention relates to an improvement in or relating to a cradle which is adapted to receive a carrier for semiconductor elements.

(2) Description of the Prior Art

A cradle of the above sort is constructed in such a way that it receives a carrier and is then mounted on a predetermined position on the rotor of a spin drier so as to spin semiconductor elements, for example, silicon wafers at a high speed in such a state as stored in the carrier, which is made of a resin, for removing water and hence drying the semiconductor elements.

Conventional cradles were each constructed in such a way that its rear wall was connected to both of its side walls respectively by way of inclined wall portions. No problem was developed with such conventional cradles where semiconductor elements were wafers having small specific gravities and relatively small diameters. In the case of semiconductor elements having large specific gravities or large wafers, the leg portions of a carrier which leg portions were provided at the bottom of the carrier were pressed strongly against the rear wall of the cradle owing to centrifugal forces applied thereto, thereby opening the leg portions and causing the leg portions to ride on the inclined wall portions of the cradle. Thus, the conventional cradles were accompanied by a drawback that wafers stored in their respective carriers would be damaged.

SUMMARY OF THE INVENTION

An object of this invention is to solve the above-mentioned drawback of the conventional cradles and thus to provide a cradle suitable for a semiconductor element carrier, which cradle permits to perform a spinning dry operation without damaging semiconductor elements even if such semiconductor elements have a large specific gravity or a relatively large size.

In one aspect of this invention, there is thus provided a cradle having a rear wall and adapted to receive a carrier, which is provided with leg portions and carries semiconductor elements stored therein, for mounting the carrier on a predetermined position of a spin drier, which cradle comprises a pair of stepped portions provided parallelly to each other and perpendicularly to the rear wall of the cradle so as to receive the leg portions of the carrier between the stepped portions.

The stepped portions hold their corresponding leg portions of the carrier so as to protect the leg portions from being opened due to centrifugal forces to be applied thereto.

The above and other objects, features and advantages of the present invention will become apparent from the following description and the appended claims, taken in conjunction with the accompanying drawings.

DETAILED DESCRIPTION OF THE INVENTION AND PREFERRED EMBODIMENTS

Figure 1:
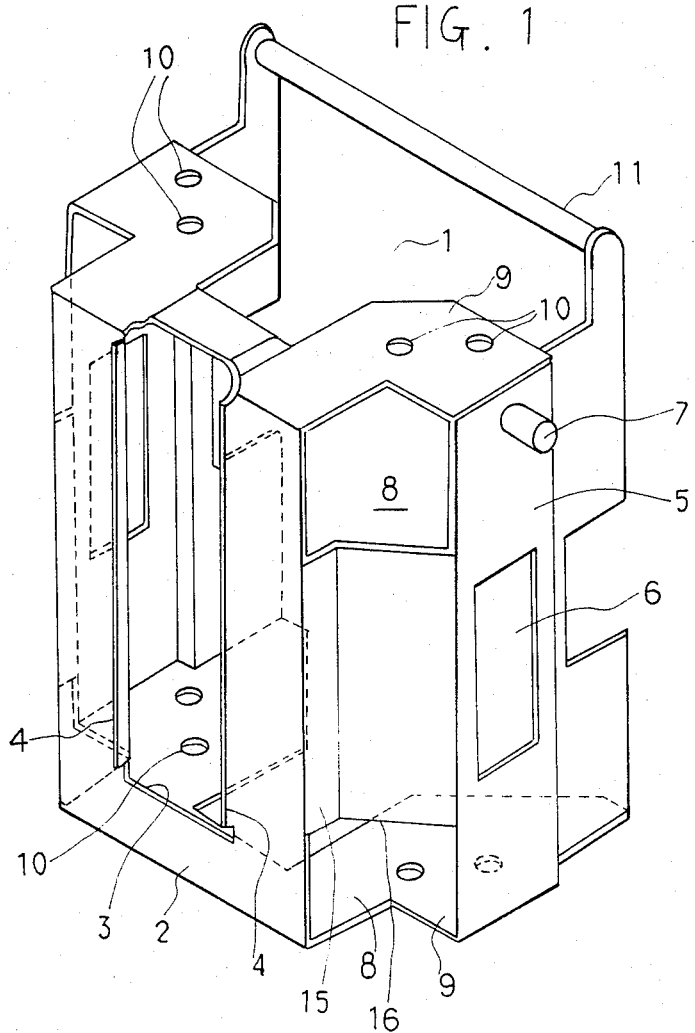
FIG. 1 is a perspective view of a cradle according to one embodiment of this invention.

One embodiment of the present invention will next be described with reference to the accompanying drawings. Referring firstly to FIG. 1 of the drawings, numeral 1 is a front opening through which a carrier is mounted on the cradle. Numeral 2 indicates a rear wall which defines a central window 3 for releasing water and air therethrough. Along both side edges of the window 3, there are provided ribs 4. These ribs 4 serve as reinforcement members against warping of the rear wall 2. Side walls 5 extend between the front opening 1 and the rear wall 2, and define respectively windows 6 so that both water and air may be allowed to escape therethrough. A short rod 7 is provided on both of the side walls 5 at a location adjacent to its upper extremity. This short rod 7 serves as a fulcrum for the turning of the cradle upon mounting or dismounting the cradle on or from the rotor of a spin drier. In addition, spacings 8 are formed in both upper and lower end corners between the side walls 5 and the rear wall 2. These spacings 8 receive the corners of each carrier and at the same time, permit the passage of water and air therethrough. Through end walls 9 provided respectively at both ends of the cradle, there are formed a suitable number of through-holes 10. A holding rod (not illustrated) may be caused to extend through one through-hole 10 formed through the upper end wall 9 and its corresponding through-hole 10 formed through the lower end wall 9, whereby successfully holding a smaller carrier in the same cradle. Designated at numeral 11 is a rod-like handle adapted to pull up the dradle manually. The rod-like handle 11 may be replaced by mere projections. Incidentally, the cradle is generally made of stainless steel.

Figure 2:
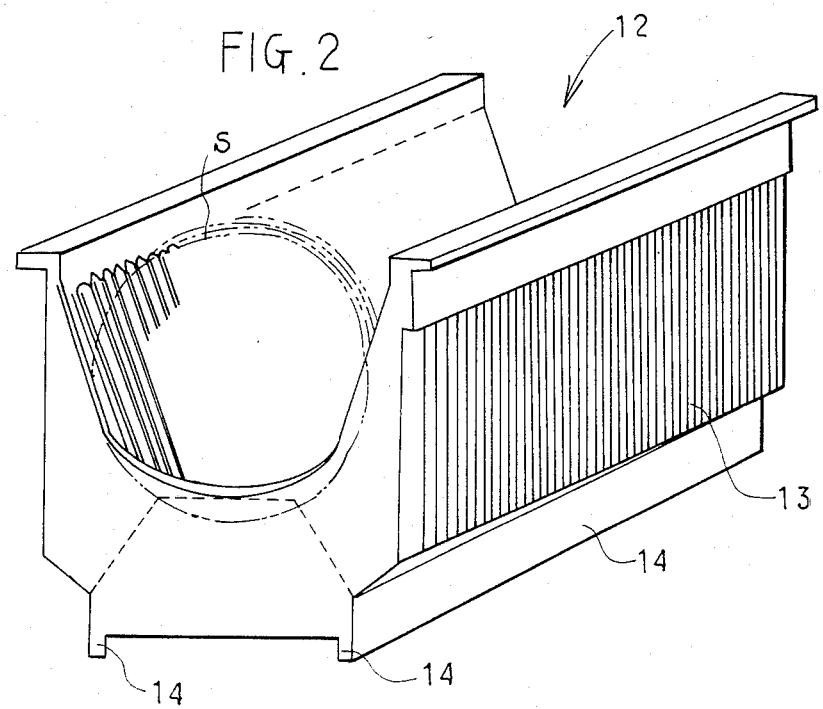
FIG. 2 is a perspective view of one example of a carrier to be provided with the cradle.

FIG. 2 illustrates one example of a carrier 12 which is to be received in the cradle. In both side walls 13 of the carrier 12, there are formed a suitable number of grooves in which wafers are to be received. Leg portions 14 are provided respectively along both bottom side edges of the carrier 12. When mounted in the cradle, the leg portions 14 are kept in contact with the rear wall 2 of the cradle as depicted in FIG. 3.

Figure 4:
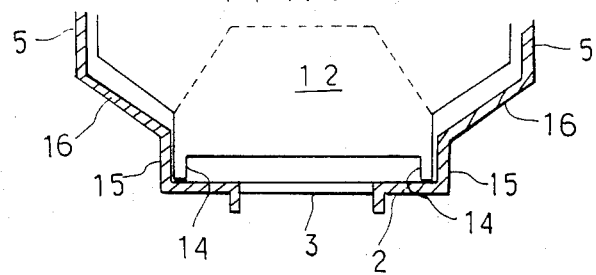
FIG. 4 is a transverse cross-sectional view of a rear portion of the cradle.

In the case of the cradle according to this invention, stepped portions 15 are respectively provided along both sides of the rear wall 2 as seen in FIGS. 1 and 4. These stepped portions 15 extend out at right angles relative to the rear wall 2 in such a way that they are parallel to each other, so that the leg portions 14 of the carrier 12 are received between the stepped portions 15. Accordingly, the distance between the stepped portions 15 is, as illustrated in FIG. 4, slightly wider than the distance between the leg portions 14 of the carrier 12. In addition, the height of each of the stepped portions 15 is somewhat higher than the height of each of the leg portions 14 of the carrier 12. The front edges of the stepped portions 15 are connected to inclined wall portions 16, which extend to their corresponding side walls 5. It is preferred to form the rear wall 2, stepped portions 15, inclined portions 16 and side walls 5 into a one-piece unit in accordance with the press forming technique.

Figure 5:
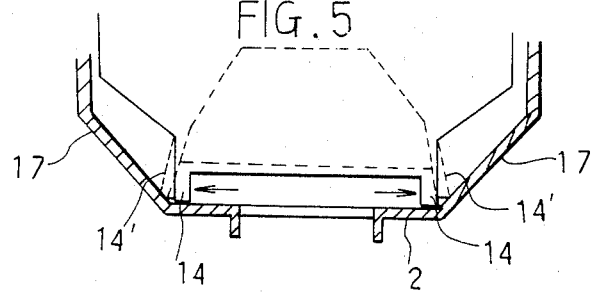
FIG. 5 is a cross-sectional view similar to FIG. 4, which illustrates a conventional cradle structure.
Figure 3:
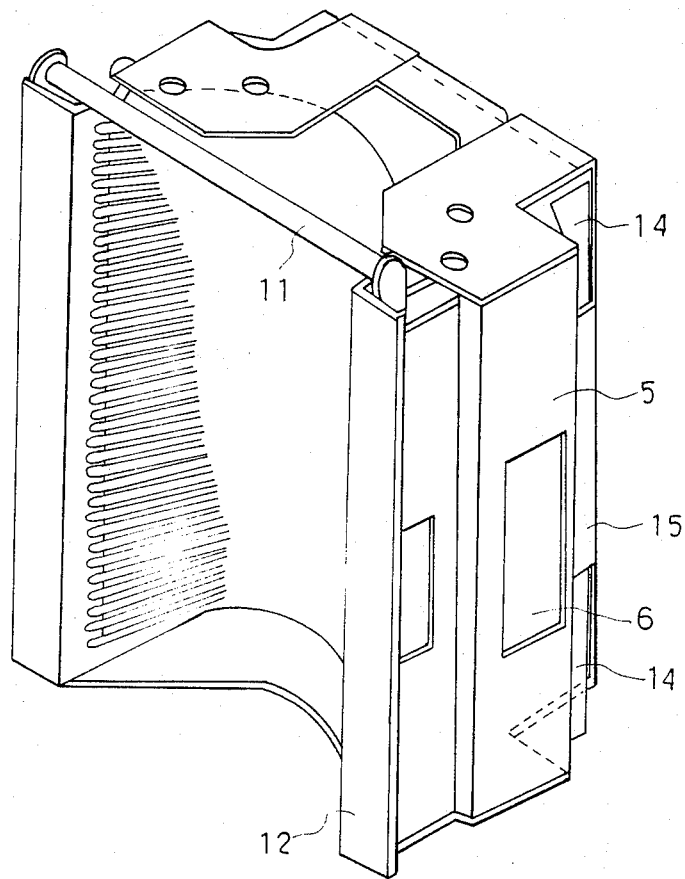
FIG. 3 is a perspective view showing the carrier provided in the cradle.

In order to remove water from the wafers stored in the carrier 12 for drying same, the carrier is mounted in the cradle as illustrated in FIG. 3. The carrier is then mounted on a predetermined position of the spin drier, by way of the cradle. When the carrier 12 is received in the cradle according to this invention, the leg portions 14 of the carrier 12 are kept in contact with the rear wall 2 of the cradle and at the same time, the pair of leg portions 14 of the carrier 12 is received between the stepped portions 15 of the cradle. Therefore, the leg portions 14 are protected from opening sidewards. When the cradle is spinned at a high speed together with the carrier in the spin drier, the carrier 12 is pressed against the rear wall 2. In the case of a cradle having a conventional structure, the leg portions 14 of the carrier are caused to ride on the inclined portions 17 provided between the rear wall and the side walls 5 and are thus opened as shown by chain line 14' in FIG. 5, thereby developing such a drawback as mentioned above. In the case of a cradle according to this invention, the leg portions 14 of the carrier 12 are held in place by their corresponding stepped portions 15 and are thus prevented from opening as mentioned above.

Accordingly, the leg portions of a carrier are held in place so as to prevent them from opening due to centrifugal forces in this invention even if semiconductor elements have large specific gravities or relatively large sizes. Therefore, it is possible to conduct the spin-drying of semiconductor elements suitably by means of a spin drier without damaging them.

Having now fully described the invention, it will be apparent to one of ordinary skill in the art that many changes and modifications can be made thereto without departing from the spirit or scope of the invention as set forth herein.

What is claimed is:

1. A cradle for receiving a carrier which has leg portions and contains semiconductor elements stored therein, and mounting said carrier on a predetermined position of a spin drier, which cradle comprises a rear wall with a window therein, said rear wall having a pair of end edges and a pair of side edges, a pair of opposed end walls extending at right angles from said rear wall end edges, a pair of stepped portions extending at right angles from said rear wall side edges, an inclined wall portion extending outwardly from each said stepped portion, and a pair of opposed parallel side walls extending from said inclined wall portions, the end portions of said stepped portions and inclined wall portions being cut away to receive the corners of said carrier, the leg portions of said carrier being received between said stepped portions and restrained thereby against outward movement.

2. A cradle as claimed in claim 1, wherein the stepped portions have been formed together with the cradle as a one-piece unit by press forming.

3. A cradle as claimed in claim 1, further comprising a window in each side wall.

4. A cradle as claimed in claim 1, further comprising means for mounting said cradle in a spin drier.

5. A cradle as claimed in claim 1, further comprising a carrying handle.

6. An assembly for carrying semiconductor elements in a spin dried comprising:
(A) a carrier having means for holding a plurality of said semiconductor elements, and leg portions; and
(B) a cradle for receiving said carrier comprising a rear wall with a window therein, said rear wall having a pair of end edges and a pair of side edges, a pair of opposed end walls extending at right angles from said rear wall end edges, a pair of stepped portions extending at right angles from said rear wall side edges, an inclined wall portion extending outwardly from each said stepped portion, and a pair of opposed parallel side walls extending from said inclined wall portions, the end portions of said stepped portions and inclined wall portions being cut away to receive the corners of said carrier, the leg portions of said carrier being received between said stepped portions and restrained thereby against outward movement.

7. An assembly as claimed in claim 8, wherein the stepped portions have been formed together with the cradle as a one-piece unit by press forming.

8. An assembly as claimed in claim 6, further comprising a window in each side wall.

9. An assembly as claimed in claim 6, further comprising means for mounting said cradle in a spin drier.

10. An assembly as claimed in claim 6, further comprising a carrying handle on said cradle.

* * * * *